(12) United States Patent
Ariel

(10) Patent No.: US 6,521,828 B2
(45) Date of Patent: Feb. 18, 2003

(54) NOTCHED GASKET FOR LOW CLOSURE FORCE EMI SHIELDING APPLICATIONS

(75) Inventor: John C. Ariel, Nashua, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 40 days.

(21) Appl. No.: 10/079,074

(22) Filed: Feb. 20, 2002

(65) Prior Publication Data
US 2002/0185292 A1 Dec. 12, 2002

Related U.S. Application Data
(60) Provisional application No. 60/290,484, filed on May 11, 2002.

(51) Int. Cl.[7] .................................................. H05K 9/00
(52) U.S. Cl. ................................. 174/35 GC; 277/920
(58) Field of Search ........................ 174/35 R, 35 GC; 361/800, 816, 818; 277/920

(56) References Cited

U.S. PATENT DOCUMENTS

| | | |
|---|---|---|
| 2,778,868 A | 1/1957 | Stinger |
| 4,227,037 A | 10/1980 | Layton |
| 4,435,565 A | 3/1984 | Stirling et al. |
| 4,545,926 A | 10/1985 | Fouts, Jr. et al. |
| 4,652,695 A | 3/1987 | Busby |
| 4,777,565 A | 10/1988 | McIntosh |
| 4,780,575 A | 10/1988 | Flavin et al. |
| 4,857,668 A | 8/1989 | Buonanno |
| 4,952,448 A | 8/1990 | Bullock et al. |
| 5,008,485 A | 4/1991 | Kitagawa |
| 5,020,866 A | 6/1991 | McIllwraith |
| 5,028,739 A | 7/1991 | Keyser et al. |
| 5,039,825 A | 8/1991 | Samarov |
| 5,045,635 A | 9/1991 | Kaplo et al. |
| 5,105,056 A | 4/1992 | Hoge, Jr. et al. |
| 5,142,101 A | 8/1992 | Matsuzaki et al. |
| 5,147,121 A | 9/1992 | McIllwraith |
| 5,150,282 A | 9/1992 | Tomura et al. |
| 5,160,807 A | 11/1992 | Fry et al. |
| 5,166,864 A | 11/1992 | Chitwood et al. |
| 5,185,654 A | 2/1993 | Mosher et al. |
| 5,202,536 A | 4/1993 | Buonanno |
| RE34,393 E | 9/1993 | McIllwraith |
| 5,260,513 A | 11/1993 | Giles et al. |
| 5,326,414 A | 7/1994 | Mosher et al. |

(List continued on next page.)

FOREIGN PATENT DOCUMENTS

| | | |
|---|---|---|
| DE | 197 28 839 C1 | 9/1998 |
| EP | 0 654 962 A1 | 11/1994 |
| JP | 5-7177 | 1/1993 |

OTHER PUBLICATIONS

International Application Published Under the PCT, International Publication No. WO96/22672.

(List continued on next page.)

Primary Examiner—Hung V. Ngo
(74) Attorney, Agent, or Firm—John A. Molnar, Jr.

(57) ABSTRACT

A EMI shielding gasket for interposition between a first and a second part of a housing or other enclosure. The gasket is supportable on the first part and extends in a longitudinal direction along a first dimension thereof. The profile includes an elongate bearing portion extending axially from a proximal to a distal end contactable by the second part. The bearing portion has an outboard side extending longitudinally intermediate the proximal and distal ends, and an inboard side extending intermediate the proximal and distal ends. The bearing portion is deformable responsive to a compressive force between the first and second parts into a stressed orientation wherein the bearing portion is deflected towards the inboard side and developing in the outboard side a localized high stress region. A stress relief portion is formed in such region which is effective to decrease the compressive force required to deform the bearing portion.

20 Claims, 5 Drawing Sheets

U.S. PATENT DOCUMENTS

| | | | |
|---|---|---|---|
| 5,566,055 | A | 10/1996 | Salvi, Jr. |
| 5,578,790 | A | 11/1996 | Peregrim |
| 5,641,438 | A | 6/1997 | Bunyan et al. |
| 5,678,699 | A | 10/1997 | Gebka |
| 5,731,541 | A | 3/1998 | Bernd et al. |
| 5,847,317 | A | 12/1998 | Phelps |
| 5,882,729 | A | 3/1999 | Kahl et al. |
| 5,910,524 | A | 6/1999 | Kalinoski |
| 6,096,158 | A | 8/2000 | Kahl et al. |
| 6,096,413 | A | 8/2000 | Kalinoski et al. |
| 6,121,545 | A | 9/2000 | Peng et al. |
| 6,323,418 | B1 * | 11/2001 | Tiburtius et al. .......... 174/35 R |
| 6,348,654 | B1 * | 2/2002 | Zhang et al. .......... 174/35 GC |

OTHER PUBLICATIONS

International Application Published Under the PCT, International Publication No. WO97/26782.

International Application Published Under the PCT, International Publication No. WO98/47340.

International Application Published Under the PCT, International Publication No. WO98/54942.

International Application Published Under the PCT, International Publication No. WO99/40769.

International Application Published Under the PCT, International Publication No. WO99/43191.

Chomerics, Parker–Hannifin Corp., brochure entitled "EMI Shielding and Grounding Spacer Gaskets" dated 1996.

Processing of Single and Multi–component Adhesives and Sealants by Paul Ivanfi, together with translation (undated).

Chomerics Parker–Hannifin Corp. Technical Bulletin 22 entitled "Cho–Shield EMI Shielding Covers" dated 1996.

Parker Seals article entitled "Parshield Conductive Elastomers" dated 1993.

Article by Shu H. Peng and W. S. Vicent Teng of Chomerics Parker–Hannifin Corporation entitled "Recent Development in Elastomeric EMI Shielding Gasket Design" (undated).

Copy of Patent Application Ser. No. 60/183,395 filed Feb. 18, 2000 and assigned to Parker–Hannifin Corporation, entitled "Manufacture of Low Closure Force, Form–inPlace EMI Shielding Gasket".

* cited by examiner

NOTCHED GASKET FOR LOW CLOSURE FORCE EMI SHIELDING APPLICATIONS

CROSS-REFERENCE TO RELATED CASES

The present application claims the benefit of the filing date of U.S. Provisional Application Serial No. 60/290,484; filed May 11, 2002.

BACKGROUND OF THE INVENTION

The present invention relates broadly to gaskets for providing environmental sealing and/or electromagnetic interference (EMI) shielding, and particularly to a low closure force EMI shielding gasket which is especially adapted for use within small electronics enclosures such as cellular phone handsets and other handheld electronic devices.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, or silicone rubber.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression or injection molding of an uncured or thermoplastic elastomer into the desired configuration.

More recently, a form-in-place (FIP) process has been proposed for the manufacture of EMI shielding gaskets. As is described in commonly-assigned U.S. Pat. Nos. 6,096,413; 5,910,524; and 5,641,438, and PCT Application WO 96/22672; and in U.S. Pat. Nos. 5,882,729 and 5,731,541; and Japanese Patent Publication (Kokai) No. 7177/1993, such process involves the application of a bead of a viscous, curable, electrically-conductive composition which is dispensed in a fluent state from a nozzle directly onto to a surface of a substrate such as a housing or other enclosure. The composition, typically a silver-filled or otherwise electrically-conductive silicone elastomer, then is cured-in-place via the application of heat or with atmospheric moisture or ultraviolet (UV) radiation to form an electrically-conductive, elastomeric EMI shielding gasket in situ on the substrate surface.

Another recent EMI shielding solution for electronics enclosures, which solution is further described in commonly-assigned U.S. Pat. No. 5,566,055 and in DE 19728839 involves the over-molding of the housing or cover with an conductive elastomer. The elastomer is integrally molded in a relatively thin layer across the inside surface of the housing or cover, and in a relatively thicker layer along the interface locations thereof providing both a gasket-like response for environmentally sealing the cover to the housing and electrical continuity for the EMI shielding of the enclosure. The elastomer additionally may be molded onto interior partitions of the cover or housing, or itself molded to integrally-form such partitions, providing electromagneticly-isolated compartments between potentially interfering circuitry components. Covers of such type are marketed commercially under the name Cho-Shield® Cover by the Chomerics EMC Division of Parker-Hannifin Corporation (Woburn, Mass.).

Yet another solution for shielding electronics enclosures, and particularly the smaller enclosures typical of cellular phone handsets and other handheld electronic devices, concerns the incorporation of a thin plastic retainer or frame as a supporting member of the gasket. As is described in commonly-assigned U.S. Pat. No. 6,121,545, the electrically conductive elastomer may be molded or, as is described in U.S. Pat. No. 5,731,541, formed-in-place or otherwise attached to the inner or inner peripheral edge surfaces and/or to the upper or lower face surfaces of the frame. So constructed, the gasket and frame assembly may be integrated within the electronic device to provide a low impedance pathway between, for example, peripheral ground traces on a printed circuit board (PCB) of the device, and other components thereof such as the conductive coating of a plastic housing, another PCB, or a keypad assembly. Uses for the spacer gaskets of the type herein include EMI shielding applications within digital cellular, handyphone, and personal communications services (PCS) handsets, PC cards (PCMCIA cards), global positioning systems (GPS), radio receivers, and other handheld devices such as personal digital assistants (PDAs). Other uses include as replacements for metal EMI shielding "fences" on PCBs in wireless telecommunication devices.

Requirements for typical small enclosure applications generally specify a low impedance, low profile connection which is deflectable under relatively low closure force loads, e.g., about 1.0–8.0 lbs per inch (0.2–1.5 kg per cm) of gasket length. Usually, a minimum deflection, typically of about 10%, also is specified to ensure that the gasket sufficiently conforms to the mating housing or board surfaces to develop an electrically conductive pathway therebetween. It has been observed that for certain applications, however, that the closure or other deflection force required to effect the specified minimum deflection of conventional profiles may be higher than can be accommodated by the particular housing or board assembly design.

One method of achieving a lower closure force gasket design particularly adapted for use in smaller electronic enclosure packages has been to form the gasket as having a periodic "interrupted" pattern of alternating local maxima and minima heights. Conventionally, and as is described in commonly-assigned, co-pending application U.S. Ser. No. 09/703,240, filed Oct. 31, 2000, in the Technical Publication "EMI Shielding and Grounding Spacer Gasket," Parker Chomerics Division, Woburn, Mass. (1996), and in PCT application 98/54942, gaskets of such type may be formed by molding or the FIP process as having a crenelated, i.e., notched, serrated, or a sinusoidal "waveform" profile, or as a series of discrete beads. In general, for a specified joint configuration, a gasket having such an "interrupted" profile or pattern would be expected to exhibit a greater deflection under a given compressive load than a continuous profile.

Another method of achieving a lower closure force in a spacer gasket design is described in commonly-assigned U.S. Pat. No. 6,121,545. Such method involves configuring the gasket as having a moment arm portion which is angularly deflectable in an inward or outward direction relative to the frame responsive to a compressively-applied load. As a result of the described bending mode response, such gasket is seen to exhibit force deflection than gasket profiles operating in a conventional compression mode.

As the sizes of handheld electronic devices such as cellular phone handsets has continued to shrink, it will be appreciated that further improvements in the design of gaskets profiles therefor would be well-received by the electronics industry. Especially desired would be a low closure force gasket profile which is adapted for use in the smaller electronics enclosures which are increasingly becoming the industry standard.

BROAD STATEMENT OF THE INVENTION

The present invention is directed to a low closure force gasket profile for environmental sealing and/or electromagnetic interference (EMI) shielding which is especially adapted for use in smaller electronic enclosure packages. The gasket profile of the invention features a moment arm or bending portion which is responsive to a compressively-applied load, such as when compressed between two surfaces of a housing or other enclosure, to be angularly deflectable in an inward or outward direction relative to the interior or exterior of the housing or other substrate on which the gasket may be supported. The described bending mode response advantageously provides a large but controlled deflection affording a more uniform interface contact with the contacting surface for more assured electrical and physical continuity and, in turn, more reliable EMI shielding and environmental sealing effectiveness. When employed, for example, in electronics applications, the gasket of the invention therefore provides consistent EMI shielding and, additionally, environmental sealing effectiveness.

In accordance with the precepts of the present invention, the bending mode response of the gasket is controlled by the incorporation of a stress relief portion on the side of the gasket opposite the side to which the gasket is deflected about a bending point. In this regard, it has been observed though mathematical modeling that the gasket side opposite the bending point develops a local region of high stress or strain which develops as the side is stretched. By forming a shoulder, notch, or other stress relieving feature into this region of high stress, the force required for the transition of the gasket from a compression to a bending mode response may be lowered with a corresponding decrease in the load force required for a given deflection. The result is a gasket profile which is observed to exhibit lower closure force requirements as compared to a gasket profile which operates solely in a compression rather than a bending mode or which lacks the described stress relief feature. That is, for a specified joint configuration, the gasket profile of the present invention exhibits a greater deflection under a given compressive load than more conventional profiles.

In an illustrative embodiment, the gasket profile of the invention may be molded or otherwise supported on an edge or other surface of a housing or other enclosure for an electronic device such as a cellular telephone. When supported on an inward edge surface of the enclosure, the moment arm portion of the gasket may be angled or otherwise shaped to develop an outward force component advantageously directing the deflection of the moment arm portion toward the enclosure edge and away from the interior thereof wherein the gasket might otherwise interfere with the proper operation of the circuits or other electronics being housed within the enclosure.

Advantages of the present invention include the provision of an improved gasket profile for low closure force applications such as may be found in small, handheld electronic devices. Additional advantages includes a gasket profile which exhibits a controlled deflection response for more stable interface contact with the housing or circuit board components of the enclosure and, in turn, more assured electrical continuity and reliable EMI shielding effectiveness. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
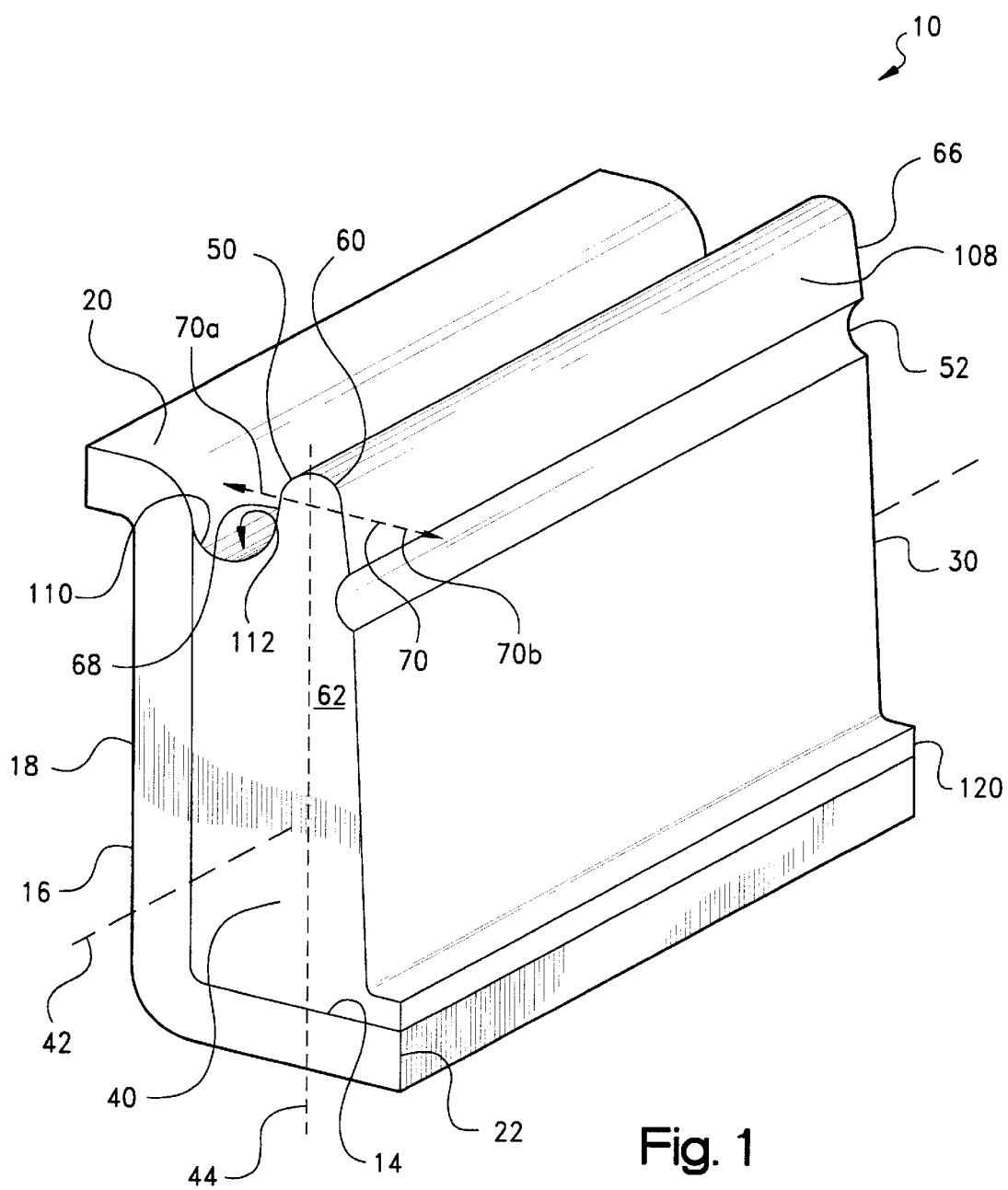
FIG. 1 is a perspective end view of a representative EMI shielding assembly which includes a housing part along the edges of which is molded an illustrative embodiment of a gasket profile in accordance with the present invention.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "interior," "inner," or "inboard" and "outward," "exterior," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of the invention herein involved are described in connection with the molding or other application of an elastomeric, electrically-conductive, electromagnetic interference (EMI) shielding gasket onto sidewall or other surface of one part of an enclosure for a handheld electronic device such as a cellular telephone. In view of the discourse to follow, however, it will be appreciated that aspects of the present invention may find utility in other EMI shielding applications, such as for cabinets, spacer frame gaskets, circuit boards, or EMI shielding caps, or in non-electrically-conductive and/or thermally-conductive embodiments for environmental sealing and/or heat transfer applications. Use within those such other applications therefore should be considered to be expressly within the scope of the present invention.

Referring then to the figures wherein corresponding reference characters are used to designate corresponding elements throughout the several views with equivalent elements being referenced with prime or sequential alphanumeric designations, an exemplary sealing assembly for EMI shielding applications is shown generally at 10 in FIG. 1 as including a part, 12, which may be, as shown, a housing or other enclosure of an electronic device, or, alternatively, a spacer frame such as is further described in commonly-assigned U.S. Pat. No. 6,121,545. The device which includes housing or other part 12 may be a cellular telephone or, alternatively another handheld or other electronic device such as a personal communications services (PCS) handset, PCMCIA card, global positioning system (GPS), radio receiver, personal digital assistant (PDA), or the like. Housing part 12 has an inner surface, 14, and an outer surface, 16, which extend to form sides walls, one of which is referenced at 18, therebetween having a peripheral edge surface, 20, and to form an end wall, 22, adjoining the side walls 18. Edge surface 20 functions as an interface surface with a faying edge or other interfacing surface of a mating housing part (not shown), which interfacing surface may have a stepped configuration to provide an inner and outer interface contact with the mating housing part 12. Typically, the interior of the housing part 12 defines or is partitioned into one or more separate cavities (not shown) for providing one or more electromagnetically isolated compartments for the circuitry of the device.

For many applications, housing part 12 may be injection or otherwise molded of a thermoplastic or other polymeric material such as a poly(ether ether ketone), polyimide, high molecular weight polyethylene, polypropylene, polyetherimide, polybutylene terephthalate, nylon, fluoropolymer, polysulfone, polyester, ABS, acetal homo or copolymer, or a liquid crystal polymer. In the case of an electrically-nonconductive material, the housing part inner surface 14 may be painted, metallized, or otherwise provided with a metal or metal-filled coating layer. Alternatively, housing part 12 may be formed of a relatively lightweight metal such as magnesium or aluminum.

A resilient gasket, a constitute segment of which is referenced at 30, is molded or otherwise retained, such as by adhesive bonding or an interference fit, on the inner surface 14 of side wall 18 and optionally, end wall 22, to be compressible axially under a predetermined compressive load intermediate end wall surface 20 and the corresponding surface of the mating housing part (not shown). In this regard, gasket 30 preferably is overmolded onto the sidewall inner surface by injection or compression molding, and is formed of an elastomeric material which specifically may be selected for temperature, chemical, or physical compatibility with the housing material. Depending then upon the application, suitable materials may include natural rubbers such as Hevea, as well as thermoplastic, i.e., melt-processible, or thermosetting, i.e., vulcanizable, synthetic rubbers such as fluoropolymers, chlorosulfonate, polybutadiene, polybutadiene, buna-N, butyl, neoprene, nitrile, polyisoprene, silicone, fluorosilicone, copolymer rubbers such as ethylene-propylene (EPR), ethylene-propylene-diene monomer (EPDM), nitrile-butadiene (NBR) and styrene-butadiene (SBR), or blends such as ethylene or propylene-EPDM, EPR, or NBR. The term "synthetic rubbers" also should be understood to encompass materials which alternatively may be classified broadly as thermoplastic or thermosetting elastomers such as polyurethanes, silicones, fluorosilicones, styrene-isoprene-styrene (SIS), and styrene-butadiene-styrene (SBS), as well as other polymers which exhibit rubber-like properties such as plasticized nylons, polyesters, ethylene vinyl acetates, and polyvinyl chlorides. As used herein, the term "elastomeric" is ascribed its conventional meaning of exhibiting rubber-like properties of compliancy, resiliency or compression deflection, low compression set, flexibility, and an ability to recover after deformation.

Preferably for EMI shielding applications, the elastomeric material is selected to be a silicone or fluorosilicone material. In general, silicone elastomers exhibit desirable properties such as thermal and oxidation resistance over a wide temperature range, as well as resistance to many chemicals and to weather effects. These materials further exhibit excellent electrical properties including resistance to corona breakdown over a wide range of temperatures and humidity.

For EMI shielding applications, the silicone or other elastomeric material may be rendered electrically conductive for providing an electrically conductive pathway between the interfacing surfaces via the loading of a continuous binder phase of the material with an electrically-conductive filler. Suitable electrically-conductive fillers include nickel and nickel-plated substrates such as graphite and noble metals, and silver and silver-plated substrates such as: pure silver; silver-plated noble metals such as silver-plated gold; silver-plated non-noble metals such as silver-plated copper, nickel, aluminum, and tin; and silver-plated glass, ceramics, plastics, elastomers, and mica; and mixtures thereof. The shape of the filler is not considered critical to the present invention, and may include any shape that is conventionally involved in the manufacture or formulation of conductive materials of the type herein involved including solid spheres, hollow microspheres, elastomeric balloons, flakes, platelets, fibers, rods, or irregularly-shaped particles. Similarly, the particle size of the filler is not considered critical, but generally will be in the range of from about 0.250–250 $\mu$m, with a range of from about 0.250–75 $\mu$m being preferred.

The filler is loaded in the composition in a proportion sufficient to provide the level of electrical conductivity and EMI shielding effectiveness in the cured gasket which is desired for the intended application. For most applications, an EMI shielding effectiveness of at least 10 dB, and preferably at least 20 dB, and most preferably at least 100 dB or higher, over a frequency range of from about 10 MHz to 12 GHz is considered acceptable. Such effectiveness translates to a filler proportion which generally is between about 10–80% by volume, based on the total volume of the reaction system, and preferably is between about 20–70% by volume. As is known, however, the ultimate shielding effectiveness of the cured gasket will vary based on the amount of electrically-conductive material in the filler and the imposed load or deflection, typically between about 10–50%, of the gasket.

Alternatively, the electrically conductive filler may be provided as a relatively thin, i.e., 1–10 mil (0.025–0.25 mm), plating or coating layer covering gasket 30. In the case of a coating, such layer may be formulated as a silicone, fluorosilicone, or other elastomeric binder which forms a continuous phase within which the filler is dispersed.

With continuing reference to FIG. 1, it may be seen that gasket 30 is formed as a body, 40, of an indefinite length which extends in a longitudinal direction, referenced as axis 42, along at least one dimension of the housing part 12, and in an axial direction, referenced as axis 44, which is generally normal to the longitudinal direction 42. Depending upon the configuration of housing part 12, gasket 30 and, accordingly, body 40 thereof may be continuous or discontinuous, and may trace a linear, curved, rectilinear, curvilinear, or other shape path along longitudinal axis 42.

In basic construction, gasket body 40 is configured as having a profile which effects a controlled deflection response in the gasket 30. Such profile includes, particularly, an elongate bearing portion, 50, and, in accordance with the precepts of the present invention, a stress relief portion, 52, which is formed integrally with the bearing portion 50.

Figure 2:
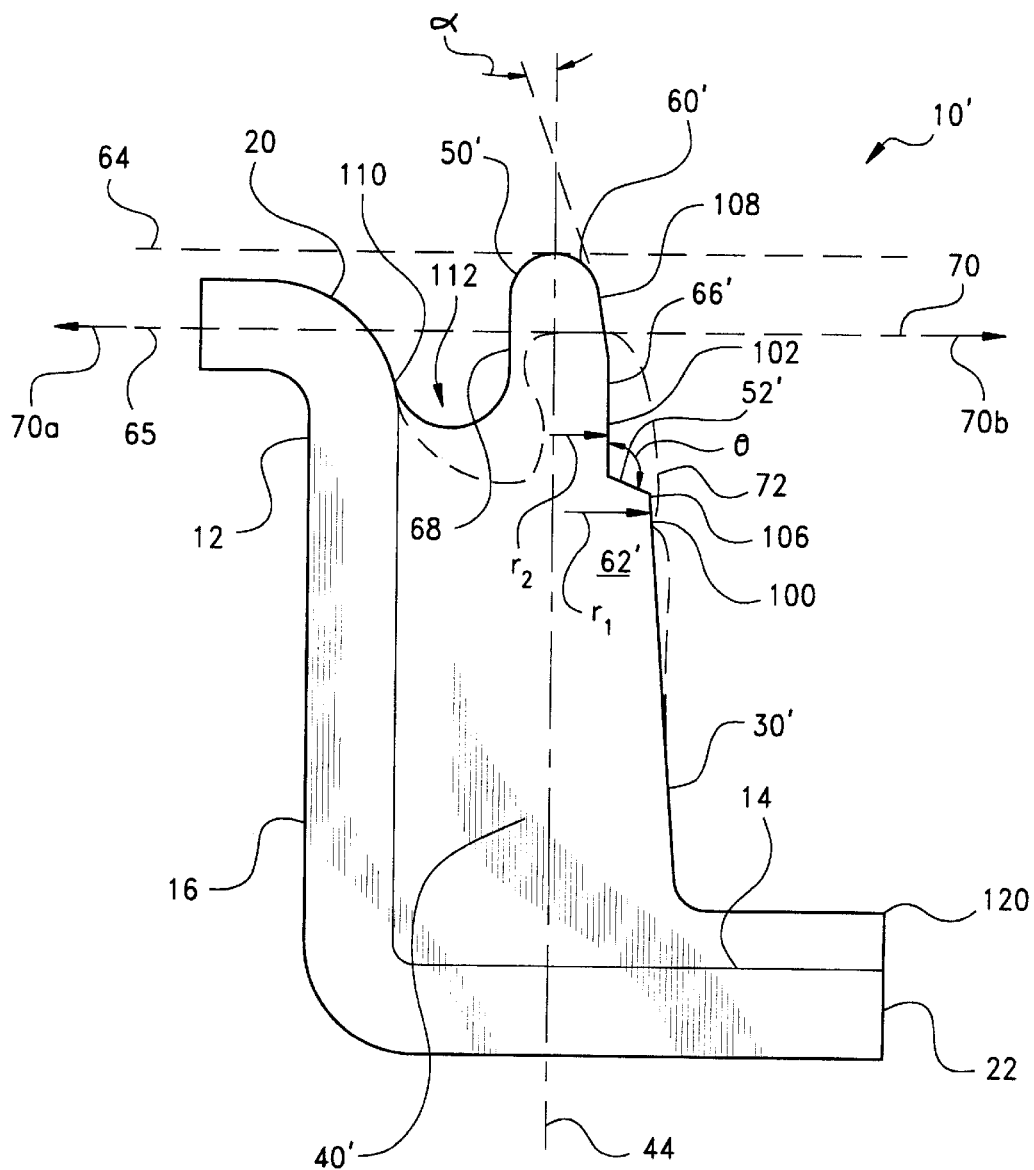
FIG. 2 is a cross-sectional view of an alternative embodiment of the gasket profile of FIG. 1.

Bearing portion 50 extends in an axial direction along axis 44 in an unstressed orientation from a proximal end, 60, to a distal end, shown at 62, which is connectable by a confronting surface of the second housing part (referenced in phantom in FIG. 2 at 64). Bearing portion 50 further is configured as having an outboard side, 66, and an inboard side, 68. Outboard side 66 extends intermediate the proximal and distal ends 60 and 62 in a longitudinal direction along axis 42. Inboard side 68, in turn, extends intermediate the proximal and distal ends 60 and 62 opposite outboard side 66, and defines therewith a radial direction, referenced by axis 70, which for purposes of convention is termed "inward" in the direction referenced at 70a towards the inboard side 68 and "outward" in the direction referenced at 70b towards the outboard side 66.

With reference momentarily to the cross-sectional view of FIG. 2, bearing portion 50 (referenced at 50' in FIG. 2) is deformable responsive to an axially-directed compressive force of given magnitude, such as is developed by the axial displacement of surface 64, the displaced surface being commonly referenced at 65 with axis 70, in the direction of the first housing part 12, between the housing parts into the stressed orientation shown in phantom at 72. As may be seen, such orientation 72 is characterized in that bearing portion 50 (referenced at 50' in FIG. 2) is deflected in the radial inward direction 70a. By "deflected," it is meant that the bearing portion 50' is deflected angularly, or otherwise bent or folded, generally intermediate its proximal and distal ends 60 and 62 (referenced at 60' and 62' in FIG. 2), about a corresponding bending or moment arm.

It has been observed that the described deflection of bearing portion 50 into the stressed orientation 72 correspondingly develops in outboard side 66 a localized region of relatively high stress generally between the proximal and distal ends 60 and 62. Stress relief portion 52 thus is formed generally in such region and is effective to decrease the magnitude of the compressive force required for effecting the deformation of bearing portion 50 into its stressed orientation 72.

Figure 3A:
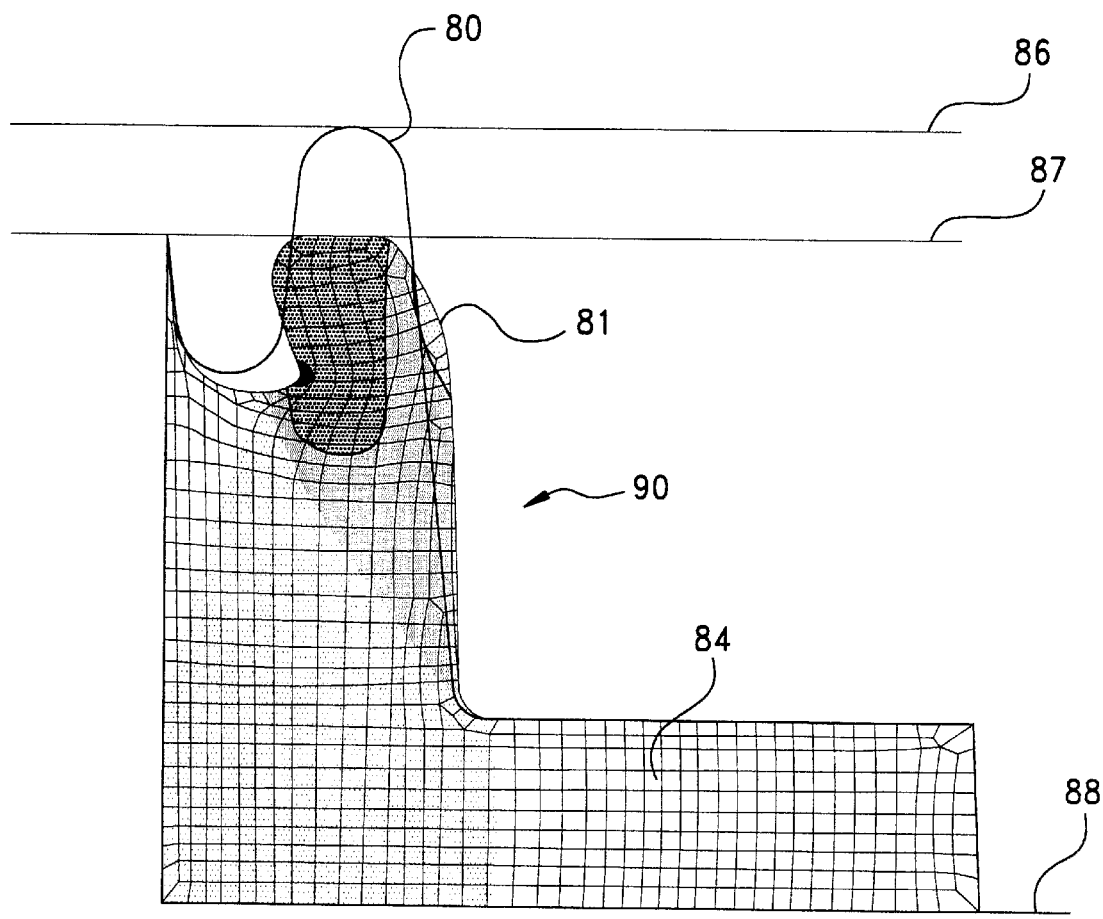
FIG. 3A is a graphical representation of a finite element model of the predicted stress distribution in a representative low closure force gasket profile without the stress-relieving feature of the present invention.
Figure 3B:
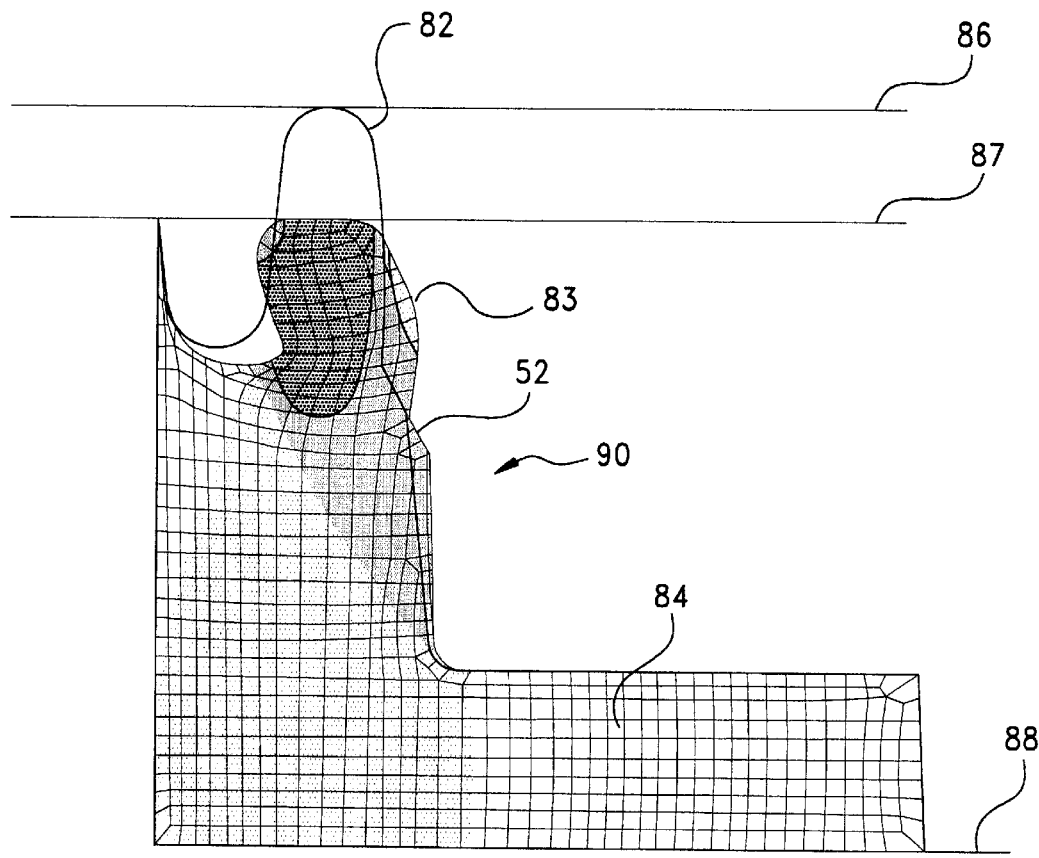
FIG. 3B is a comparative graphical representation of a finite element model of the predicted stress distribution in a representative low closure force gasket profile which includes the stress-relieving feature of the present invention.

In this regard, reference may be had to FIGS. 3A and 3B wherein the static load-deflection responses of gasket profiles formed without, referenced at 80 in FIG. 3A, and with, referenced at 82 in FIG. 3B, the described stress relief portion 52 are modeled using a nonlinear finite element analysis (FEA) program, MARC K6 (MARC Analysis Research Corp., Palo Alto, Calif.). The results for each of the gasket profiles 80 and 82 are plotted for the second component of Cauchy stress at a given deflection by means of the four-node plane strain Hermann elements which are represented by the grid lines commonly referenced at 84. In the plots of FIGS. 3A and 3B, the profiles are in phantom at 80 and 82, respectively, in their uncompressed or normal orientation which is superimposed over the deformed or stressed orientation referenced at 81 and 83, respectively.

The compression of the profiles 80 and 82 was simulated using a contact element which is shown as the plane commonly referenced by line 86 prior to compression/displacement, and by line 87 after compression/displacement. The opposing edge surface, 88, was considered in the analysis as a rigid body relative to the gasket profiles. As mentioned, profile 80 of FIG. 3A differs from profile 82 essentially in lacking the stress relief portion 52 (FIG. 1) or 52' (FIG. 2), but otherwise is comparable in size and other geometry.

Based upon the above models, the load-deflection responses of the gasket profiles were predicted by finite element analysis using the Mooney-Rivlin strain energy function, $$W = C_1(I_1-1) + C_2(I_2-1) \tag{1}$$

where $C_1$, $C_2$, are material coefficients, and $I_1$, $I_2$ are strain invariants, which reduces to the Ogden function, $$W = \sum_{i=1}^{m} \frac{\mu_i}{\alpha_i}(\lambda_1^{\alpha_i} + \lambda_2^{\alpha_i} + \lambda_3^{\alpha_i} - 3) \tag{2}$$

where $\lambda_1$, $\lambda_2$, $\lambda_3$ are the stretch ratios and $\alpha_i$, $\mu_i$ are the material coefficients. For a two-term Ogden model, i.e., m=2, Eqs. 1 and 2 are equivalent. Table 1 summarizes the two-term Ogden constants and the bulk modulus, which was used to account for the near incompressibility of elastomeric materials, of a representative silicone-based, filled elastomeric molding material.

TABLE 1

| Representative Ogden Model Material Constants | |
|---|---|
| Bulk Modulus | K = 200,000 psi |
| Ogden Constants | $\mu_1$ = −173 psi |
| | $\mu_2$ = −522 psi |
| | $\alpha_1$ = 2 |
| | $\alpha_2$ = −2 |

In the FEA models of FIGS. 3A and 3B, the predicted stress component distribution in the vertical direction are shown by contour shading with darker areas indicating regions of increasing compressive stress. In both of the profiles 80 and 82, it may be seen that a localized region of relatively high stress, commonly referenced at 90, is developed in the outboard side of the profile body. The stress relief portion of profile 52 of profile 82 is formed within this region 90 and has the effect of decreasing the magnitude of the compressive force required for effecting a given deflection of the profile.

Figure 4:
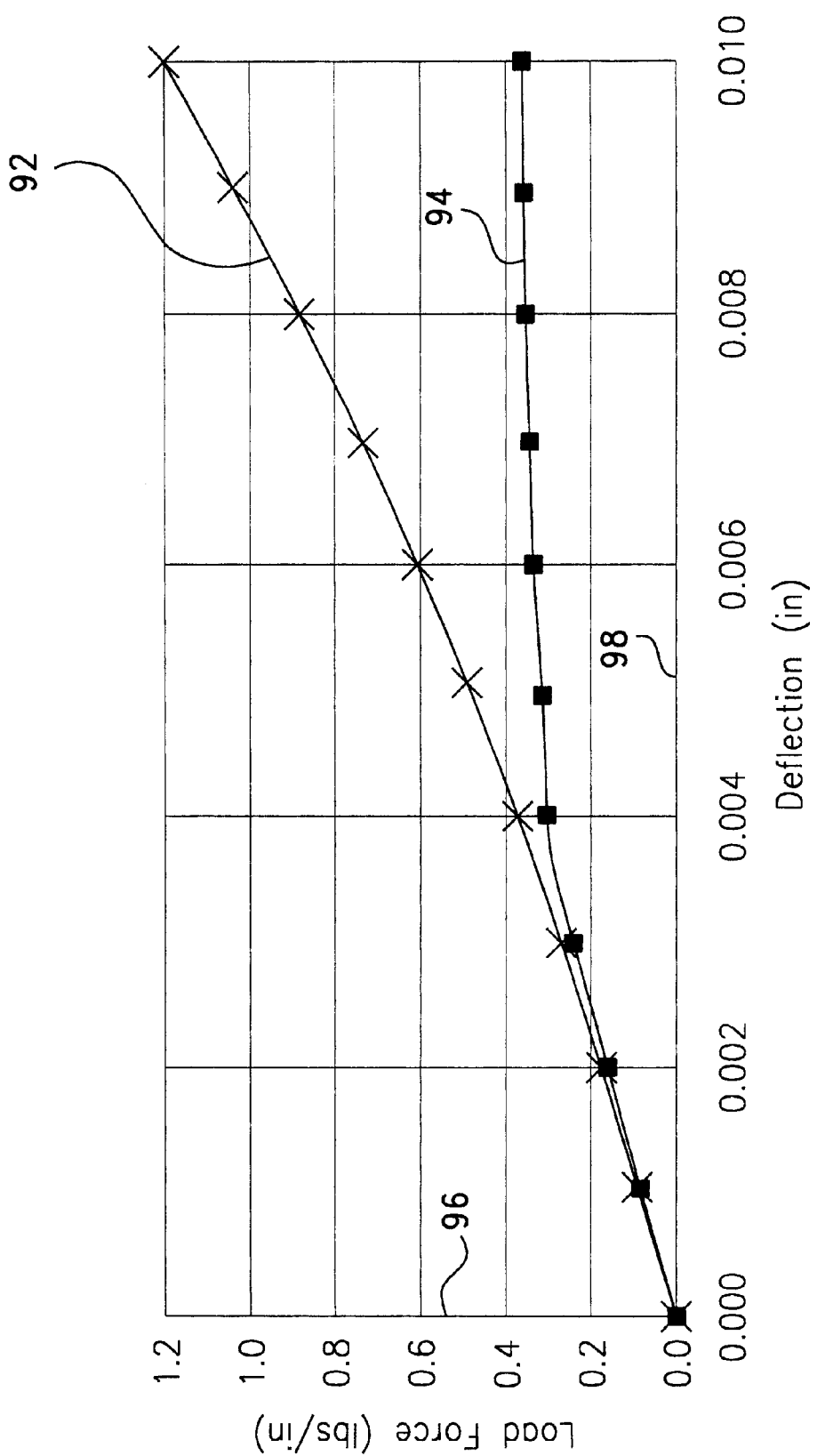
FIG. 4 is a plot comparing the force-deflection responses of the gasket profiles of FIGS. 3A and 3B.

Quantitatively, the net effect of the provision of the stress relief portion 52 may be seen in FIG. 4. In FIG. 4, normalized load-deflection curves are plotted at 92 and 94 as functions of total load force along the axis designated 96 and deflection displacement along the axis designated 98 for unit lengths of, respectively, the gasket profile 80 of FIG. 3A (curve 92), and the comparably dimensioned profile 82 (curve 94) of the present invention.

From the results of FIG. 4, it may be seen that within a given application, the force required to deflect a profile design which includes the stress relief portion 52 will be lower than for a comparable design. Indeed, the provision of the described stress relief portion generally will be observed to reduce the load force required to effect a given deflection by up to about 80% or more as compared to the deflection otherwise attainable. In this regard, the incorporation of a stress relief portion may be used to increase the range of deflection for the gasket profile of the present invention, and thereby to make it suitable for use in a variety of applications. Accordingly, it will be appreciated that the gasket of the present invention is especially adapted for use in EMI shielding applications, such as in communication handsets and other handheld devices, which specify a low closure force shielding solution. Moreover, by virtue of the described deflection of the gasket, increased surface area contact may be developed between the gasket and the interfacing surface for improved electrical continuity.

Returning to FIG. 1, it may be seen that in the illustrative embodiment of gasket 30, stress relief portion 52 is provided within body 40 thereof as a notch, groove, radius, or the like formed within the outboard side 66 of the bearing portion 50. Alternatively, and as is shown at 52' in FIG. 2, stress relief portion 52 may be formed within the outboard side 66' as a shoulder or like. For example, the outboard side 66' of bearing portion 50' may be defined as having a first surface portion, 100, disposed generally intermediate the proximal and distal ends 60' and 62', and a second surface portion, 102, disposed generally intermediate the first surface portion 100 and distal end 62'. With first surface portion 100 extending a first distance, referenced at $r_1$, in the outward radial direction 70b from axis 44, and with the second surface portion 102 extending a second distance, referenced at $r_2$, which is less than the first direction $r_1$, stress relief portion 52' thereby may be formed as an adjoining shoulder surface, 106, which extends axially between the first and second surface portions 100 and 102. Shoulder surface 106 may be radiused and/or, as is shown, oriented to define a generally acute angle, referenced at θ, with the second surface portion 102.

All or part of the second surface portion 102, as shown at 108 in FIGS. 1 and 2, similarly may be canted towards the radial inboard direction 70a to define an acute angle, referenced at α in FIG. 2, with axis 44. Such cantation of second surface 102 further assists in the controlled deflection of the gasket 30 (FIG. 1) and 30' (FIG. 2) in developing a camming or other force component. Such force component may be used to urge the deflection of the bearing portion 50, 50' towards the inboard radial direction 70a and, advantageously in the illustrated embodiment, away from the interior of the housing part 12 wherein the gasket 30, 30' might otherwise interfere with the proper operation of the circuit boards of the device. To accommodate this deflection, gasket body 40, 40' may be seen to be supported on the inner surface 14 of housing part sidewall 18 by a lateral portion, 110, which is disposed opposite the bearing portion outward side 66, 66' and radial inwardly of inboard side 68, 68'. Such configuration of lateral portion 110 disposes bearing portion 50, 50' a spaced-apart distance in the outward radial direction 70b from the side wall 18. Bearing portion 50, 50' further may be separated from sidewall 18 by a groove portion, 112, which extends radially intermediate lateral portion 110 and bearing portion inboard side 68, 68'.

Lastly in the illustrative embodiment of gasket 30 and 30' of FIGS. 1 and 2, respectively, gasket body 40, 40' further may be formed as having an integral layer portion, 120. Such portion 120, which extends transversely from outboard side 66, 66' in the outward radial direction 70b, may be molded with the remainder of body 40, 40', or otherwise supported on the inner surface 14 of end wall 22, to provide additional surface area for the attachment of gasket 30, 30'. Layer portion 120 also may be used, if provided as a covering across the inner surface 14, as an EMI shielding layer for the housing part 12 in a manner further described in commonly-assigned U.S. Pat. No. 5,566,055.

In view of the foregoing, other gasket profiles incorporating the stress relief portion of the present invention may be envisioned. For example, gasket 30 may be supported on a horizontal edge surface of a sidewall in a housing part. Alternatively, gasket 30 may be configured to be generally symmetrical with a pair of axially-opposing bearing portions 50 so as to be supportable on a spacer gasket frame of the type further described in commonly-assigned U.S. Pat. Nos. 6,121,545, and 5,731,541.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A resilient gasket profile compressible between a first part and a second part, said gasket being supportable on the first part and extending in a longitudinal direction along a first dimension of the first part, and in an axial direction generally perpendicular to said longitudinal direction, said gasket profile comprising:

an elongate bearing portion which extends in an unstressed orientation in said axial direction from a proximal end to a distal end contactable by the second part, said bearing portion having an outboard side extending intermediate said proximal and said distal end along said longitudinal direction, and an inboard side extending intermediate said proximal and said distal end opposite said outboard side and defining between said outboard side a radial inward direction towards said inboard side and a radial outward direction towards said outboard side, said bearing portion being deformable responsive to an axially-directed compressive force of given magnitude between the first and the second part into a stressed orientation characterized in that said bearing portion is deflected in said radial inward direction and developing in said outboard side a localized region of relatively high stress; and a stress relief portion formed generally in said localized region of said relatively high stress, said stress relief portion being effective to decrease the magnitude of said compressive force effecting the deformation of said bearing portion into said stressed orientation.

2. The gasket profile of claim 1 wherein:

said bearing portion has a central axis in said axial direction; and said outboard side has a first surface portion intermediate said distal and said proximal end, and a second surface portion intermediate said first surface portion and said distal end, said first surface portion extending a first distance in said radial outward direction from said central axis, and said second surface portion extending a second distance in said radial outward direction from said central axis less than said first direction to define said stress relief portion as a shoulder surface extending between said first and said second surface portion.

3. The gasket profile of claim 2 wherein said shoulder surface defines an acute angle with said second surface portion.

4. The gasket profile of claim 1 wherein said gasket profile is formed of an elastomeric polymeric material.

5. The gasket of claim 4 wherein said polymeric material contains an electrically-conductive filler.

6. The gasket profile of claim 1 wherein said second surface portion is canted towards said radial inboard direction developing a force component responsive to said compressive load directing the deflection of said bearing portions towards said radial inboard direction.

7. The gasket profile of claim 1 wherein:

the first part has a side wall which extends along said longitudinal direction; and said gasket profile further comprises a lateral portion disposed opposite said outboard side of said bearing portion and radial inwardly of said bearing portion inboard side, said lateral portion being supportable on the side wall disposing said bearing portion a spaced-apart distance in said radial outward direction from the side wall accommodating the deflection of said bearing portion in said radial inward direction.

8. The gasket profile of claim 7 wherein:

the first part further has an end wall adjoining the side wall; and said gasket profile further comprises a layer portion which extends transversely from said outboard side in said radial outward direction, said layer portion being supportable on the end wall to provide a covering thereon.

9. The gasket profile of claim 7 further comprising a groove portion which extends intermediate said lateral portion and said inboard side of said bearing portion, said groove portion separating said bearing portion from the side wall of the first part.

10. The gasket profile of claim 1 wherein said stress relief portion is configured as a groove formed within the outboard said of said bearing portion intermediate the proximal and distal ends thereof.

11. A sealing assembly comprising:

a first part;

a second part;

resilient gasket profile compressible between said first and said second part, said gasket being supported on said first part and extending in a longitudinal direction along a first dimension of said first part, and in an axial direction generally perpendicular to said longitudinal direction, said gasket profile including:

an elongate bearing portion which extends in an unstressed orientation in said axial direction from a proximal end to a distal end contactable by said second part, said bearing portion having an outboard side extending intermediate said proximal and said distal end along said longitudinal direction, and an inboard side extending intermediate said proximal and said distal end opposite said outboard side and defining with said outboard side a radial direction therebetween, said bearing portion being deformable responsive to an axially-directed compressive force of given magnitude between said first and said second part into a stressed orientation characterized in that said bearing portion is deflected towards said inboard side and developing in said outboard side a localized region of relatively high stress; and a stress relief portion formed generally in said localized region of said relatively high stress, said stress relief portion being effective to decrease the magnitude of said compressive force effecting the deformation of said bearing portion into said stressed orientation.

12. The assembly of claim 11 wherein:

said bearing portion has a central axis in said axial direction; and said outboard side has a first surface portion intermediate said distal and said proximal end, and a second surface portion intermediate said first surface portion and said distal end, said first surface portion extending a first distance in said radial outward direction from said central axis, and said second surface portion extending a second distance in said radial outward direction from said central axis less than said first direction to define said stress relief portion as a shoulder surface extending between said first and said second surface portion.

13. The assembly of claim 12 wherein said shoulder surface defines an acute angle with said second surface portion.

14. The assembly of claim 11 wherein said gasket profile is formed of an elastomeric polymeric material.

15. The gasket of claim 14 wherein said polymeric material contains an electrically-conductive filler.

16. The assembly of claim 11 wherein said second surface portion is canted towards said radial inboard direction developing a force component responsive to said compressive load directing the deflection of said bearing portions towards said radial inboard direction.

17. The assembly of claim 11 wherein:

said first part has a side wall which extends along said longitudinal direction; and said assembly further comprises a lateral portion disposed opposite said outboard side of said bearing portion and radial inwardly of said bearing portion inboard side, said lateral portion being supported on the side wall disposing said bearing portion a spaced-apart distance in said radial outward direction from said side wall accommodating the deflection of said bearing portion in said radial inward direction.

18. The assembly of claim 17 wherein:

said first part further has an end wall adjoining said side wall; and said assembly further comprises a layer portion which extends transversely from said outboard side in said radial outward direction, said layer portion being supported on the end wall to provide a covering thereon.

19. The assembly of claim 17 further comprising a groove portion which extends intermediate said lateral portion and said inboard side of said bearing portion, said groove portion separating said bearing portion from said side wall of said first part.

20. The assembly of claim 11 wherein said stress relief portion is configured as a groove formed within the outboard said of said bearing portion intermediate the proximal and distal ends thereof.

* * * * *